(12) United States Patent
Nakamura

(10) Patent No.: US 11,442,347 B2
(45) Date of Patent: Sep. 13, 2022

(54) LIGHT SOURCE DEVICE HAVING ROTATING WHEEL AND IMAGE PROJECTION APPARATUS INCLUDING THE SAME

(71) Applicant: CANON KABUSHIKI KAISHA, Tokyo (JP)

(72) Inventor: Tomohiro Nakamura, Yoshikawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 132 days.

(21) Appl. No.: 16/926,354

(22) Filed: Jul. 10, 2020

(65) Prior Publication Data

US 2021/0018822 A1    Jan. 21, 2021

(30) Foreign Application Priority Data

Jul. 16, 2019    (JP) .............................. JP2019-131061

(51) Int. Cl.
| | | |
|---|---|---|
| *G03B 21/20* | (2006.01) | |
| *G02B 26/00* | (2006.01) | |
| *H01L 33/50* | (2010.01) | |
| *H04N 9/31* | (2006.01) | |
| *G02B 27/14* | (2006.01) | |

(52) U.S. Cl.
CPC ......... *G03B 21/204* (2013.01); *G02B 26/008* (2013.01); *G02B 27/141* (2013.01); *G03B 21/2013* (2013.01); *G03B 21/2066* (2013.01); *H01L 33/50* (2013.01); *H04N 9/3161* (2013.01); *H04N 9/3164* (2013.01); *H04N 9/3167* (2013.01)

(58) Field of Classification Search
CPC ................ G02B 26/008; G02B 27/141; G02B 27/1046; H01L 33/50; G03B 21/208; G03B 21/204; G03B 21/2013; G03B 21/2066; G03B 21/2073; G03B 33/12; H04N 9/3158; H04N 9/3167; H04N 9/3164; H04N 9/3161
See application file for complete search history.

(56) References Cited

U.S. PATENT DOCUMENTS

2014/0211170 A1* 7/2014 Kitano ................. H04N 9/3161
                                                                  353/31
2018/0188640 A1* 7/2018 Huang ................. H04N 9/3155

FOREIGN PATENT DOCUMENTS

| JP | 2012-137608 A | 7/2012 |
|---|---|---|
| JP | 2018-054780 A | 4/2018 |
| JP | 2018-087839 A | 6/2018 |
| JP | 2018-124445 A | 8/2018 |

* cited by examiner

*Primary Examiner* — Joseph L Williams
*Assistant Examiner* — Jose M Diaz
(74) *Attorney, Agent, or Firm* — Canon U.S.A., Inc. IP Division

(57) ABSTRACT

A light source device includes a light source unit and a rotating wheel. The light source unit is configured to emit first blue light and second blue light. The rotating wheel includes a diffuser layer configured to diffuse and transmit the first blue light, and a phosphor layer configured to convert at least a part of the second blue light into yellow light.

19 Claims, 13 Drawing Sheets

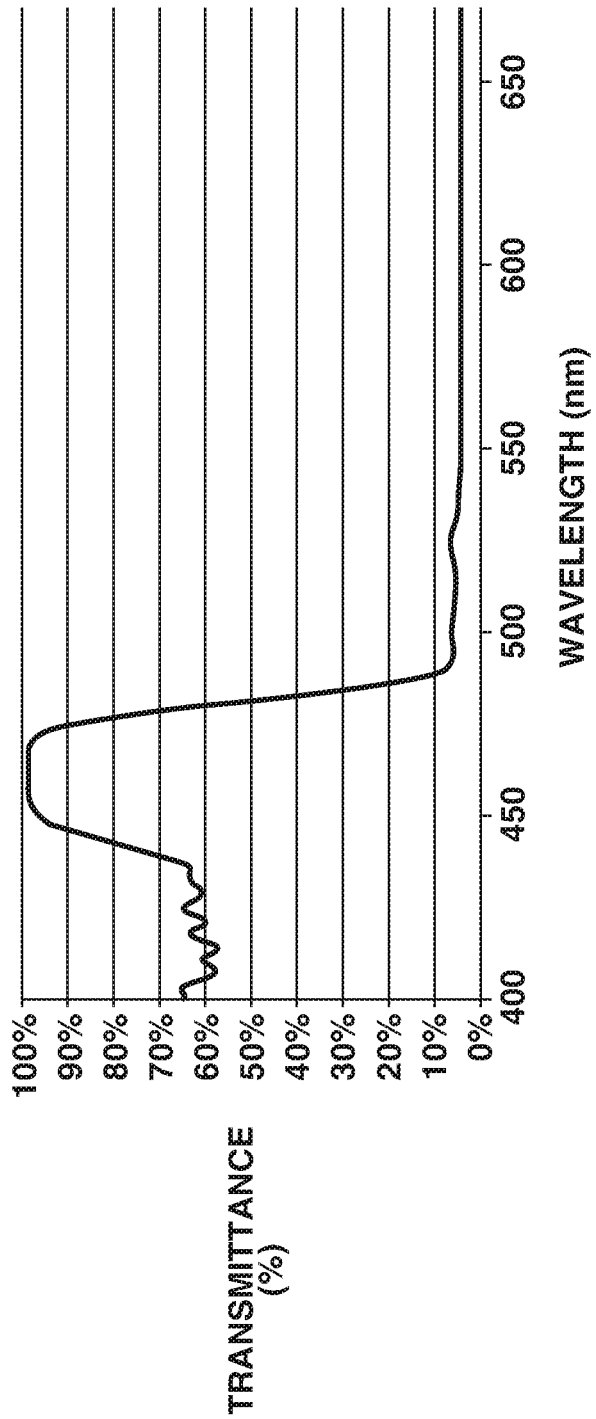

LIGHT SOURCE DEVICE HAVING ROTATING WHEEL AND IMAGE PROJECTION APPARATUS INCLUDING THE SAME

BACKGROUND

Field

One disclosed aspect of the embodiments relates to a light source device and an image projection apparatus including the same.

Description of the Related Art

As a light source device for a projector (an image projection apparatus), a light source device discussed in the publication of Japanese Patent Application Laid-Open No. 2018-124445 is known. The light source device discussed in the publication of Japanese Patent Application Laid-Open No. 2018-124445 includes a first rotating wheel having a wavelength conversion element, and a second rotating wheel having a diffusion element (diffuser). The light source device also includes a first blue laser diode (hereinafter, "blue LD") from which blue light is emitted toward the first rotating wheel, and a second blue LD from which blue light is emitted toward the second rotating wheel.

In the light source device discussed in the publication of Japanese Patent Application Laid-Open No. 2018-124445, blue light emitted from the first blue LD is diffusely reflected by the first rotating wheel and converted into yellow light by wavelength conversion. Then, the yellow light is projected onto a screen through a liquid crystal panel at the subsequent stage. Blue light emitted from the second blue LD diffusely passes through the second rotating wheel and is projected as the blue light onto the screen through the liquid crystal panel at the subsequent stage.

In the light source device discussed in the publication of Japanese Patent Application Laid-Open No. 2018-124445, since two rotating members, namely the first and second rotating wheels, are disposed, two motors for rotating the two rotating wheels are also disposed. Accordingly, the light source device discussed in the publication of Japanese Patent Application Laid-Open No. 2018-124445 is large in size due to the two rotating wheels and the two motors. In a case where the light source device is large in size, the projector is also large in size, which is not desirable.

SUMMARY

According to an aspect of the embodiments, a light source device includes a light source unit and a rotating wheel. The light source unit is configured to emit first blue light and second blue light. The rotating wheel includes a diffusion element configured to diffuse and transmit the first blue light, and a wavelength conversion element configured to convert at least a part of the second blue light into yellow light.

Further features of the disclosure will become apparent from the following description of exemplary embodiments with reference to the attached drawings.

BRIEF DESCRIPTION OF THE DRAWINGS

FIG. 4 is a diagram illustrating properties of a dichroic mirror according to the first exemplary embodiment.

DESCRIPTION OF THE EMBODIMENTS (Configuration of Projector)

Figure 1:
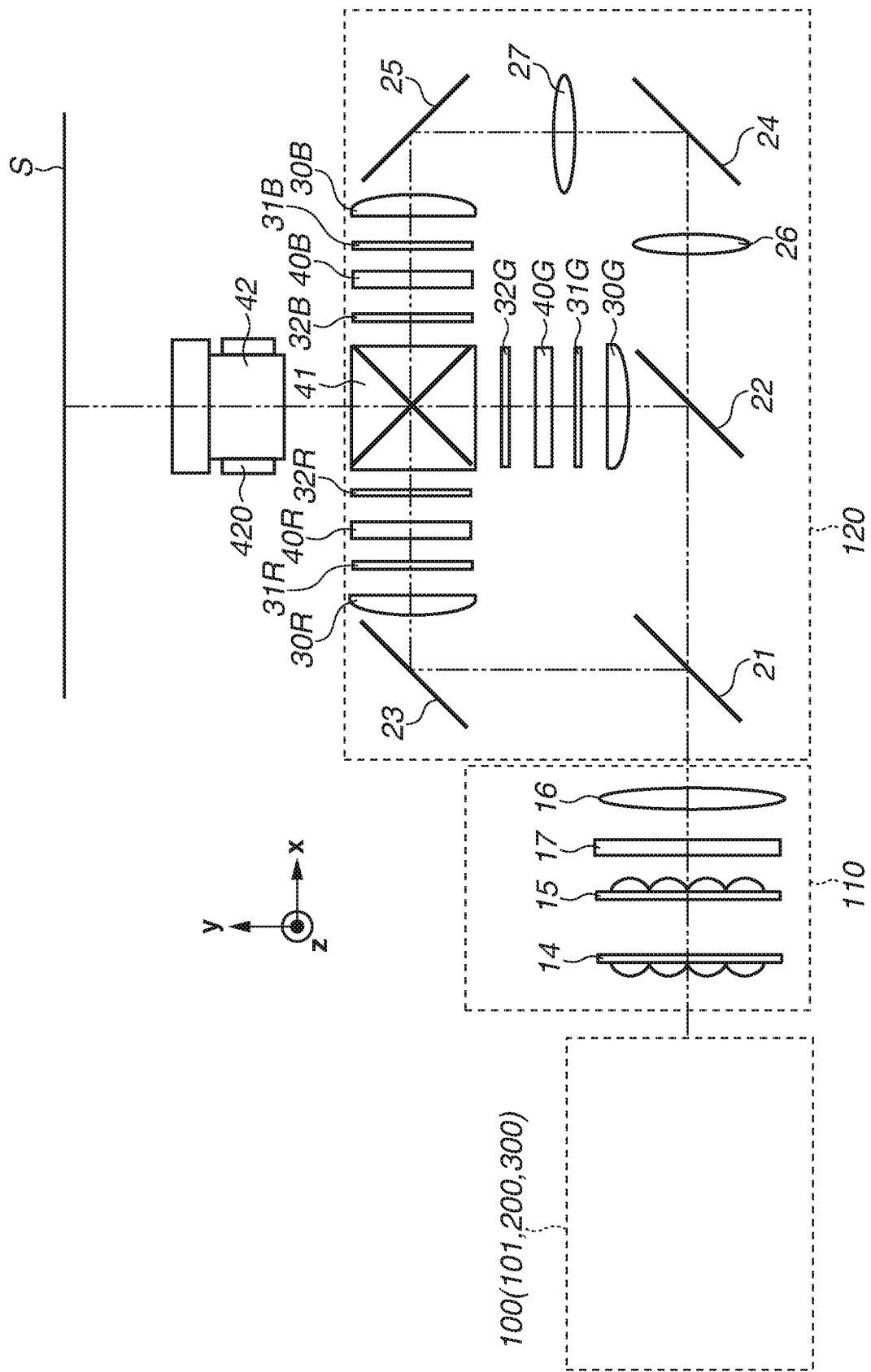
FIG. 1 is a diagram illustrating a configuration of a projector including a light source device according to each of exemplary embodiments.

With reference to FIG. 1, a description is given of a projector on which a light source device according to each of exemplary embodiments can be mounted.

In a first exemplary embodiment, a projector illustrated in FIG. 1 includes a light source device 100, an illumination optical system 110, a color separating/combining unit 120, a projection lens 42, and a lens holding unit 420 capable of holding the projection lens 42. Instead of the light source device 100, any of a light source device 200 according to a second exemplary embodiment, a light source device 300 according to a third exemplary embodiment, and a light source device 400 according to a fourth exemplary embodiment may be used.

White light emitted from the light source device 100 is projected onto a screen S after passing through the illumination optical system 110, the color separating/combining unit 120, and the projection lens 42.

The light source device according to each exemplary embodiment can be mounted on any projectors that can project an image onto the screen (projection target surface) S, including a front projector that projects an image from the front side of a screen and also a rear projector that projects an image from the back side of a screen.

The projection lens 42 may be an interchangeable lens that can be detached from the lens holding unit 420, or may be a fixed lens that cannot be detached from the lens holding unit 420.

(Configuration of Illumination Optical System 110)

The illumination optical system 110 includes a first lens array 14, a second lens array 15, a polarization conversion element 17, and a condenser lens 16 that are disposed in this order from the light source device 100.

The first lens array 14 includes a plurality of lens cells that is arranged in a matrix in a plane orthogonal to the optical axis of the illumination optical system 110 and divides light emitted from the light source device 100 into a plurality of beams.

The second lens array 15 includes a plurality of lens cells arranged in a matrix in a plane orthogonal to the optical axis of the illumination optical system 110. Each of the plurality of lens cells of the second lens array 15 corresponds to a different one of the plurality of lens cells of the first lens array 14. The second lens array 15 and the condenser lens 16 form images of the plurality of lens cells of the first lens array 14 near light modulation elements 40R, 40G, and 40B.

Between the second lens array 15 and the condenser lens 16, the polarization conversion element 17 is disposed. The polarization conversion element 17 is configured to align the polarization direction of the light emitted from the light source device 100 in a predetermined direction.

The condenser lens 16 condenses the plurality of divided beams passed through the second lens array 15 to superimpose the condensed light on the light modulation elements 40R, 40G, and 40B. That is, the first lens array 14, the second lens array 15, and the condenser lens 16 form an integrator optical system that uniformizes intensity distribution of light emitted from the light source device 100. The integrator optical system may be an optical system using a rod integrator.

(Configuration of Color Separating/Combining Unit 120)

The color separating/combining unit 120 includes a color separating/combining system and the light modulation elements 40R, 40G, and 40B. The color separating/combining system includes optical elements described below. In FIG. 1, the light modulation elements 40R, 40G, and 40B are transmissive liquid crystal panels. Alternatively, instead of the transmissive liquid crystal panels, reflective liquid crystal panels or micromirror arrays can also be used. The configuration of the color separating/combining system may be appropriately changed depending on the types of light modulation elements. While a total of three light modulation elements are disposed in the light source device in FIG. 1, the light source device according to each exemplary embodiment can also be mounted on a projector including one or two light modulation elements. In a case where a single light modulation element is included, the color separating/combining system is not necessary.

White light passed through the illumination optical system 110 is separated by color separation using a dichroic mirror 21. The dichroic mirror 21 has the property of reflecting red light and transmitting blue light and green light.

(Optical Path of Red Light)

Red light reflected from the dichroic mirror 21 is reflected by a mirror 23 and is incident on the red-light light modulation element 40R after passing through a condenser lens 30R and an incident-side polarizing plate 31R. Based on information transmitted from an input device of a computer connected to the projector, the red-light light modulation element 40R modulates the incident red light. The red light modulated by the red-light light modulation element 40R is projected onto the screen S after passing through an emission-side polarizing plate 32R, a cross dichroic prism 41, and the projection lens 42. The cross dichroic prism 41 has a cube or cuboid shape including four right angle prisms bonded together. On the surfaces on which the prisms are bonded together, dichroic films as dielectric multilayer films are formed.

(Optical Path of Green Light)

Green light reflected from the dichroic mirror 21 is incident on a dichroic mirror 22. The dichroic mirror 22 has the property of reflecting green light and transmitting blue light. The green light reflected from the dichroic mirror 22 is incident on the green-light light modulation element 40G after passing through a condenser lens 30G and an incident-side polarizing plate 31G. Similarly to the red-light light modulation element 40R, based on information transmitted from the input device, the green-light light modulation element 40G also modulates the incident green light. The green light modulated by the green-light light modulation element 40G is projected onto the screen S after passing through an emission-side polarizing plate 32G, the cross dichroic prism 41, and the projection lens 42.

(Optical Path of Blue Light)

Blue light reflected from the dichroic mirror 21 is incident on the dichroic mirror 22. As described above, the dichroic mirror 22 has the property of reflecting green light and transmitting blue light. Thus, the blue light reflected from the dichroic mirror 21 passes through the dichroic mirror 22 and is incident on the blue-light light modulation element 40B after passing through a relay optical system, a condenser lens 30B, and an incident-side polarizing plate 31B. The "relay optical system" refers to a relay lens 26, a mirror 24, a relay lens 27, and a mirror 25.

Similarly to the red-light light modulation element 40R, based on information transmitted from the input device, the blue-light light modulation element 40B also modulates the incident blue light. The blue light modulated by the blue-light light modulation element 40B is projected onto the screen S after passing through an emission-side polarizing plate 32B, the cross dichroic prism 41, and the projection lens 42.

The red light, the green light, and the blue light are projected onto the screen S through the above optical paths, whereby a color image is displayed.

Figure 2:
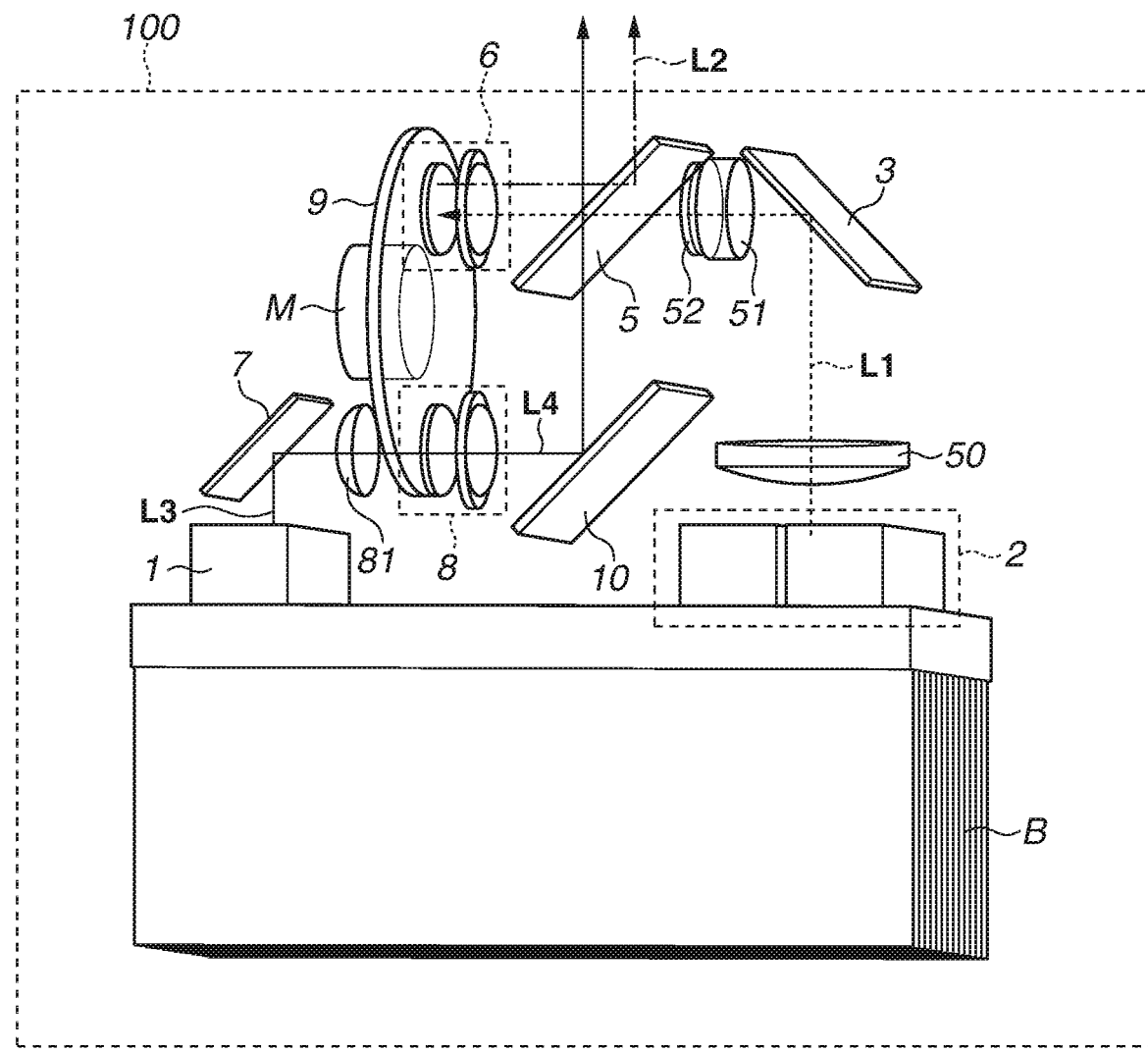
FIG. 2 is a diagram illustrating a configuration of a light source device according to a first exemplary embodiment.
Figure 3:
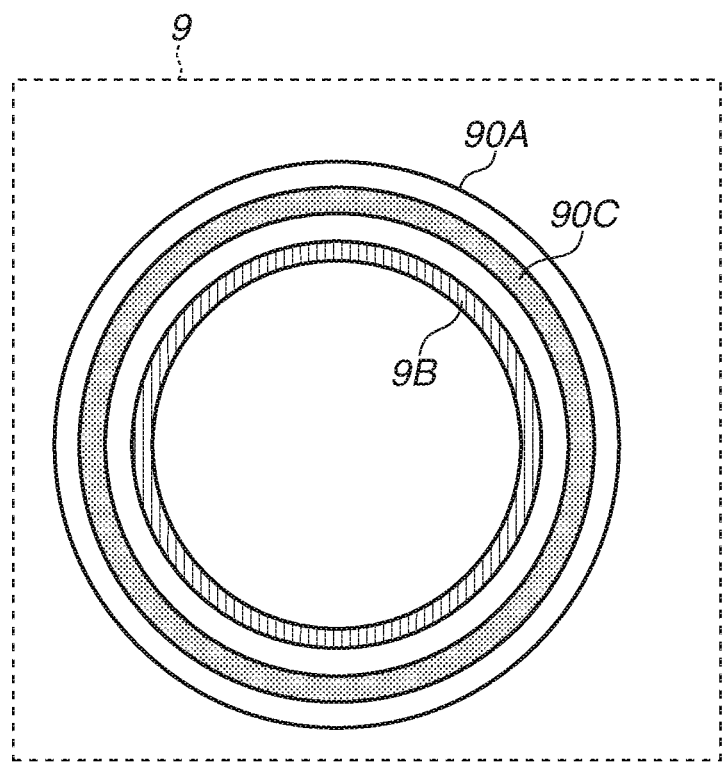
FIG. 3 is a diagram illustrating a configuration of a rotating wheel included in the light source device according to each of the exemplary embodiments.

With reference to FIGS. 2 to 4, the light source device 100 according to the first exemplary embodiment is described.

FIG. 2 is a diagram illustrating the configuration of the light source device 100. FIG. 2 illustrates a first light source unit 1 that emits blue light, and a second light source unit 2 that emits blue light. The blue light (first blue light) from the first light source unit 1 is guided to a diffuser layer (diffusion element) 90C to be described below, and the blue light (second blue light) from the second light source unit 2 is guided to a phosphor layer (wavelength conversion element) 9B to be described below.

Each of the first light source unit 1 and the second light source unit 2 is a set of blue laser diodes (LDs) (a blue LD bank) held by the same member, but may be a single blue LD (light-emitting device). More specifically, in the first, second, and third exemplary embodiments, the first light source unit 1 is a single blue LD bank, and the second light source unit 2 is two blue LD banks disposed close to (in contact with) each other. A single blue LD bank includes a total of eight blue LDs, eight collimator lenses for converting light diverging from the blue LDs into parallel light, and a holding member that holds the plurality of blue LDs and the plurality of collimator lenses. Then, on a base member B, the blue LD bank as the first light source unit 1 is disposed at a position away from the set of the two blue LD banks, the second light source unit 2. The base member B is a cooling member (a heat dissipation member) such as a heat sink or a heat pipe and has the function of cooling the light source units.

The number and the wavelength of blue LDs of the first light source unit 1 may be the same as or different from the number and the wavelength of blue LDs of the second light source unit 2. The wavelength of blue light emitted from a blue LD of each of the first light source unit 1 and the second light source unit 2 is 465 nm. Alternatively, a blue LD that emits blue light of 445 nm or 455 nm may be used. In the present exemplary embodiment, the number of blue LDs included in the first light source unit 1 is smaller than the number of blue LDs included in the second light source unit 2. Alternatively, the relationship between the numbers of blue LDs may be reversed, or the numbers of blue LDs may be the same.

The first light source unit 1 and the second light source unit 2 are both disposed on the base member B. The base member B includes a heat dissipation unit such as a plurality of fins for dissipating heat generated by the first light source unit 1 and the second light source unit 2. In the present exemplary embodiment, a plurality of light source units shares a single cooling member.

The first light source unit 1 and the second light source unit 2 may be distinguished from each other as follows. In a case where a plurality of blue LD banks is disposed on the base member B, a blue LD bank from which light is emitted toward a condenser lens (first condenser lens unit) 81 among the plurality of blue LD banks is the first light source unit 1. In a case where there is a plurality of blue LD banks from which light is emitted toward the condenser lens 81, the plurality of blue LD banks is the first light source unit 1. Similarly, a blue LD bank from which light is emitted toward a condenser lens unit (second condenser lens unit) 6 among the plurality of blue LD banks disposed on the base member B is the second light source unit 2. In a case where there is a plurality of blue LD banks from which light is emitted toward the condenser lens unit 6, the plurality of blue LD banks is the second light source unit 2.

(Optical Path of Blue Light Emitted from First Light Source Unit 1)

Blue light (blue parallel light) L3 emitted from the first light source unit 1 is reflected by a mirror 7 and condensed on the diffuser layer (diffusion element) 90C of a rotating wheel 9 by the condenser lens 81. In the present exemplary embodiment, the condenser lens 81 is a single positive lens. Alternatively, the condenser lens 81 may include a set of a plurality of lenses collectively having positive power.

As illustrated in FIG. 3, the rotating wheel 9 includes a circular plate-like rotating plate (discoid rotating plate) 90A, the annular phosphor layer 9B, and the annular diffuser layer 90C and can rotate by a motor M illustrated in FIG. 2. On the surface of the rotating plate 90A, the annular phosphor layer (wavelength conversion element) 9B and the annular diffuser layer 90C are formed on concentric circles. The rotating plate 90A has an annular penetration portion (hole portion). The diffuser layer 90C that is diffusion glass is embedded in the penetration portion. That is, the rotating plate 90A includes a portion of an inner side and a portion of an outer side with respect to the diffuser layer 90C. The inside portion is joined to the diffuser layer 90C with an adhesive, and the diffuser layer 90C is joined to the outside portion with an adhesive.

The phosphor layer 9B is formed by applying a product, which is obtained by uniformly mixing fine phosphor particles with a transparent resin binder, on the rotating plate 90A. The phosphor layer 9B, however, is not limited to the above configuration so long as incident light can be diffused to the extent that the diffused light can be properly used, and blue light can also be sufficiently converted into yellow light. For example, instead of the phosphor layer 9B, a quantum dot or a quantum rod may be used. In the present exemplary embodiment, the main material of the phosphor particles is based on yttrium aluminum garnet (YAG) and converts at least a part of blue light emitted from the second light source unit 2 into yellow light. As the main material of the quantum rod, cadmium selenide (CdSe) may be used.

In the present exemplary embodiment, since the diffuser layer and the phosphor layer are formed on the same rotating wheel, a single rotating wheel is disposed, and therefore a single rotation support mechanism and a single motor M for the rotating wheel are disposed. Thus, significant downsizing can be achieved in comparison with a configuration in which a wavelength conversion element and a diffusion element (diffuser) are formed on separate rotating wheels as in a conventional technique.

While the rotating plate 90A is made of a metal such as aluminum, the configuration is not limited to the above-described one so long as light incident on the phosphor layer 9B can be sufficiently reflected for use. While, according to the present exemplary embodiment, the phosphor layer 9B is disposed outside the diffuser layer 90C, the phosphor layer 9B may be disposed at the inner side with respect to the diffuser layer 90C.

While, in the present exemplary embodiment, the diffuser layer 90C is diffusion glass, the configuration is not limited to the above-described one so long as incident light can be diffused to the extent that the diffused light can be properly used. For example, the diffuser layer 90C may be formed by pouring a product, which is obtained by uniformly mixing fine diffusing particles with a transparent resin binder, into the penetration portion of the rotating plate 90A, and then curing the poured product.

The rotating plate 90A may not be made of a metal, and may be made of a resin or glass. In a case where the rotating plate 90A is made of a resin or glass and is transparent, the diffuser layer 90C may be formed by applying a product, which is obtained by uniformly mixing fine diffusing particles with a transparent resin binder, on the rotating plate 90A. Annular metal coating (a reflecting portion) may be applied on the surface of the rotating plate 90A, and the phosphor layer 9B may be disposed on the metal coating. On the phosphor layer 9B, light is reflected by the metal coating and the reflected light is guided to the illumination optical system 110.

The blue light, passed through the condenser lens 81, incident on the diffuser layer 90C passes through the diffuser layer 90C while being diffused by the diffuser layer 90C. The blue light passes through the diffuser layer 90C is converted into parallel light by a collimator lens unit 8, and travels to a mirror 10. While, in the present exemplary embodiment, the collimator lens unit 8 is composed of two positive lenses, the collimator lens unit 8 may be composed of a single positive lens or a set of three or more lenses collectively having positive power.

Diffused light L4 passed through the collimator lens unit 8 is reflected on the mirror 10 and incident on a dichroic mirror (first dichroic mirror or first combining element) 5. FIG. 4 illustrates the properties of the dichroic mirror 5. As illustrated in FIG. 4, the dichroic mirror 5 has high transmittance near 465 nm, which is the wavelength of blue light emitted from the first light source unit 1 and the second light source unit 2, and also has high reflectance for a band greater than or equal to 500 nm, i.e., green light and red light. Thus, the diffused light L4 reflected on the mirror 10 passes through the dichroic mirror 5 and travels to the illumination optical system 110.

(Optical Path of Blue Light Emitted from Second Light Source Unit 2)

Blue light (blue parallel light) L1 from the second light source unit 2 is compressed by a positive lens 50 and a negative lens 51 and converted into parallel light having a smaller diameter. That is, the positive lens 50 and the negative lens 51 are included in an afocal optical system (a first afocal lens unit). By compressing the blue light L1 into parallel light having a smaller diameter, the diameters of the negative lens 51 and optical elements can be downsized. The configuration of the afocal optical system is not limited to the combination of the positive lens 50 and the negative lens 51. The configuration of the afocal optical system may be, for example, a set of three or more lenses so long as the afocal optical system can compress the blue light L1 into parallel light having a small diameter. Between the positive lens 50 and the negative lens 51, a mirror 3 is disposed to bend the optical path by 90 degrees.

The blue light L1 passed through the negative lens 51 is incident on a microlens array 52. The microlens array 52 is an optical element in which a plurality of lens cells is arranged in a matrix on its incident side and emission side. The blue light L1 from the negative lens 51 is divided into a plurality of partial beams by the microlens array 52, and the plurality of partial beams is superimposed on the phosphor layer 9B by the condenser lens unit (second condenser lens unit) 6. As a result, spots having shapes similar to those of the lens cells on the incident side of the microlens array 52 are formed on the phosphor layer 9B.

Since the dichroic mirror 5 has the property of transmitting blue light as described above, the blue light passed through the microlens array 52 passes through the dichroic mirror 5 and is incident on the phosphor layer 9B through the condenser lens unit 6. Instead of the microlens array 52, a rod integrator or, for example, a light diffusion element having a concavo-convex structure may be used.

While, in the present exemplary embodiment, the condenser lens unit 6 is composed of two positive lenses, a single positive lens or a set of a plurality of lenses may be used instead of the condenser lens unit 6 so long as the set of a plurality of lenses collectively has positive power.

The blue light passed through the condenser lens unit 6 and incident on the phosphor layer 9B is converted into yellow light L2 by the above-described phosphor particles, and the yellow light L2 is reflected by the rotating plate 90A and incident on the condenser lens unit 6. While the yellow light L2 from the phosphor layer 9B is emitted in a random direction without determining the direction of the yellow light L2, the yellow light L2 is converted into parallel light by the condenser lens unit 6, reflected by the dichroic mirror 5, and guided to the illumination optical system 110. Consequently, the light source device 100 can emit blue light and yellow light, i.e., white light. Since both the diffuser layer 90C and the phosphor layer 9B are formed on the rotating plate 90A, a light source device can be downsized more significantly than in a conventional technique.

(Settings of Optical Systems)

Specific examples of optical systems are described.

The focal length of the collimator lens unit 8 is f1, and the focal length of the condenser lens unit 6 is f2. In this case, the light source device 100 satisfies the following inequalities:

$$1.2 \le f1/f2 \le 10 \tag{1}$$

and $$2.0 \le f1/f2 \le 6.0 \tag{1a}$$

In the present exemplary embodiment, f1/f2=4.0. It is, however, not essential to satisfy both conditional inequalities (1) and (1a). For example, in a case where the projector has room inside, a light source device satisfying f1/f2=1.5 may be mounted on the projector.

Conditional inequalities (1) and (1a) mean that the focal length f1 is greater than the focal length f2, i.e., the power of the collimator lens unit 8 is weaker than the power of the condenser lens unit 6. The effects obtained by the light source device 100 satisfying the conditional inequality (1) or (1a) are described with reference to FIGS. 5A, 5B, 6A, and 6B.

Figure 5A:
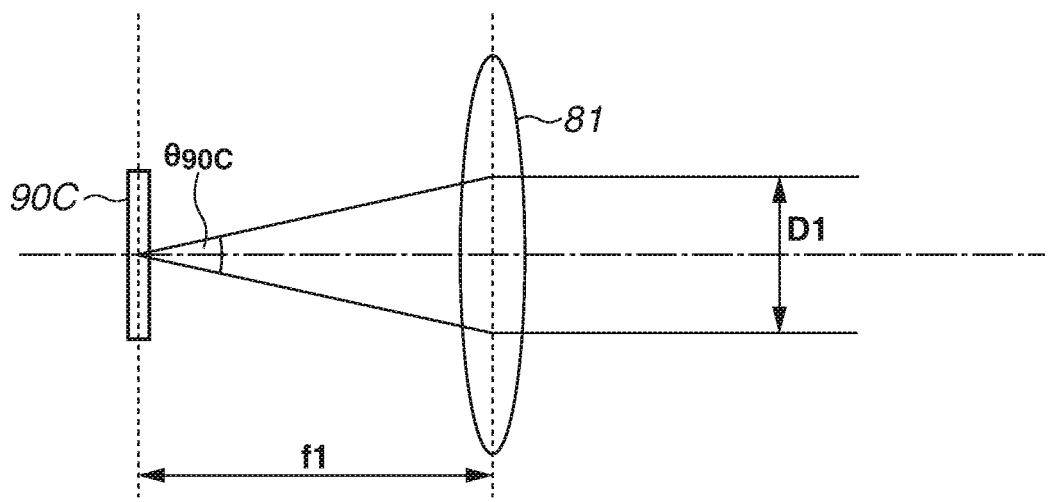
FIGS. 5A and 5B are diagrams schematically illustrating a diffuser layer and a collimator lens unit.
Figure 5B:
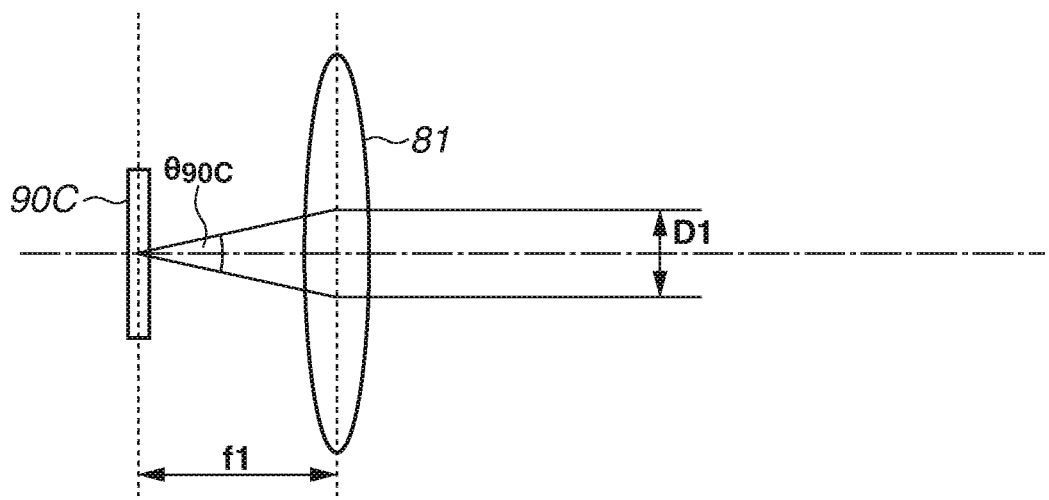

FIGS. 5A and 5B are diagrams schematically illustrating the diffuser layer 90C and the collimator lens unit 8. FIG. 5B illustrates a case where the focal length f1 is shorter than the case in FIG. 5A. When a divergence angle $\theta_{90c}$ of light emitted from the diffuser layer 90C is constant, and in a case where the focal length f1 is small, a diameter D1 of parallel light emitted from the collimator lens unit 8 is small. Conversely, in a case where the focal length f1 is great, the diameter D1 is large.

Figure 6A:
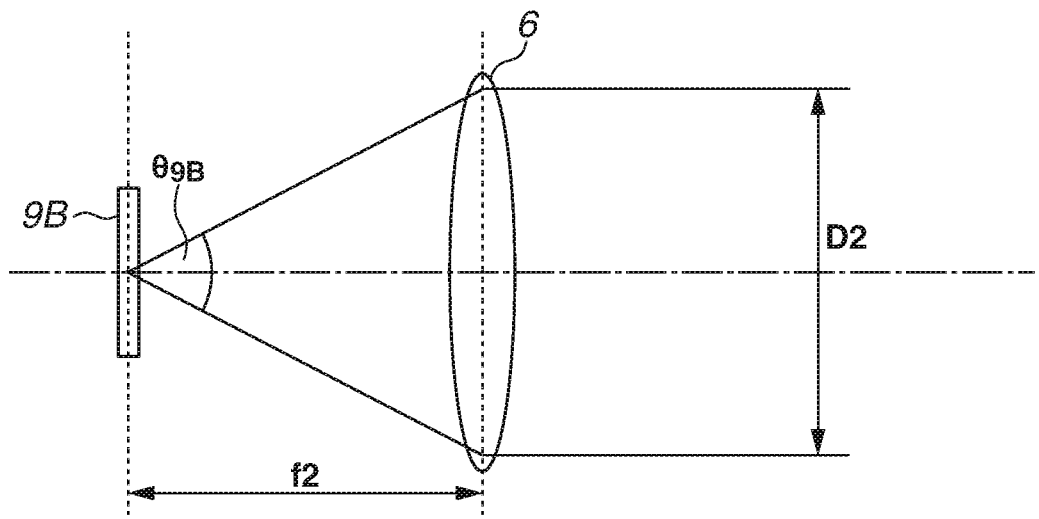
FIGS. 6A and 6B are diagrams schematically illustrating a phosphor layer and a condenser lens unit.
Figure 6B:
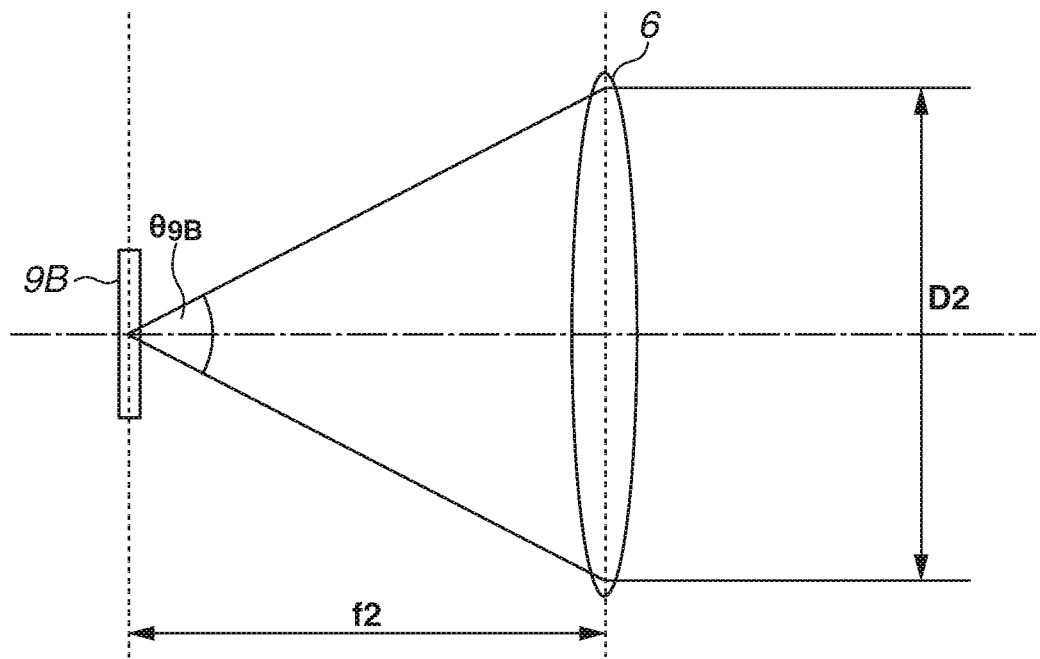

FIGS. 6A and 6B are diagrams schematically illustrating the phosphor layer 9B and the condenser lens unit 6. FIG. 6B illustrates a case where the focal length f2 is greater than the case in FIG. 6A.

As can be seen from the comparison between FIGS. 5A and 5B and FIGS. 6A and 6B, the divergence angle $\theta_{90c}$ of light passed through the diffuser layer 90C is likely to be smaller than a divergence angle $\theta_{9B}$ of light emitted from the phosphor layer 9B. This is because the diffuser layer 90C merely diffuses blue light that is laser light, emitted from a blue LD, having coherence, to the extent that the diffused blue light can be properly used. That is, the degree of diffusion by the phosphor layer 9B is greater than the degree of diffusion by the diffuser layer 90C. Thus, a diameter D2 of parallel light (blue light) emitted from the condenser lens unit 6 is likely to be larger than the diameter D1 of parallel light (yellow light) emitted from the collimator lens unit 8. If the blue light and the yellow light having different diameters from each other are guided to the light modulation elements 40R, 40G, and 40B through the illumination optical system 110, color unevenness (chromaticity uniformity) occurs in a projected image.

In the present exemplary embodiment, the focal length f1 is made great to make the diameter D1 large. This reduces the difference between the diameters D1 and D2, whereby occurrence of the above-described color unevenness is reduced. In a case where the focal length f2 is too great, the condenser lens unit 6 becomes large as illustrated in FIG. 6B. Thus, the focal length f2 is set to a value that is not too great. As a result, the light source device 100 satisfies conditional inequalities (1) and (1a).

The diffusion angle of the diffuser layer 90C is $\Phi$. In this case, the light source device 100 satisfies the following inequalities:

$$1° \le \Phi \le 30° \tag{2}$$

and $$1° \le \Phi \le 15° \tag{2a}$$

In the present exemplary embodiment, $\Phi=10°$. It is, however, not essential to satisfy both conditional inequalities (2) and (2a). For example, in a case where the projector has room inside, a light source device satisfying $\Phi=20°$ may be mounted on the projector. The diffusion angle $\Phi$ may be measured as follows. A measurement position may be set at a position corresponding to half the distance in the direction of the optical axis of the collimator lens unit 8 between the surface of the diffuser layer 90C (or the surface of the rotating plate 90A) and the vertex on the surface of the collimator lens unit 8 closest to the rotating wheel 9. The illuminance distribution of light emitted from the diffuser layer 90C at the measurement position may be measured, and the full width at half maximum of the illuminance distribution may be calculated. Then, the angle between a total of three points including two points corresponding to end portions of the full width at half maximum and the center point of the diffuser layer 90C in the radial direction may be set as the diffusion angle Φ.

Conditional inequalities (2) and (2a) mean that the diffusion angle Φ of the diffuser layer 90C is not too small and not too great. The effects obtained by the light source device 100 satisfying conditional inequality (2) or (2a) are as follows.

In a case where the diffusion angle Φ is so small as to deviate from the lower limit of conditional inequality (2), this means that light emitted from a blue LD included in the first light source unit 1 is not sufficiently diffused by the diffuser layer 90C. In a case where the light emitted from the blue LD that is laser light having coherence is not sufficiently diffused, speckle noise (an unnecessary pattern such as a light and dark speckled pattern) is likely to be visually recognized on the screen S. Conversely, in a case where the diffusion angle Φ is so great as to deviate from the upper limit of conditional inequality (2), this means that the light emitted from the blue LD included in the first light source unit 1 is excessively diffused by the diffuser layer 90C. In a case where the light emitted from the blue LD is excessively diffused by the diffuser layer 90C, the above speckle noise is reduced, but the light emitted from the diffuser layer 90C spreads more than the case described in the present exemplary embodiment. As a result, loss occurs due to a part of the blue light emitted from the diffuser layer 90C not incident on the collimator lens unit 8, or there is no choice but to make the diameter of the collimator lens unit 8 large.

As described above, the diffusion angle Φ is set so that the light source device 100 satisfies conditional inequalities (2) and (2a). Accordingly, speckle noise is reduced, upsizing of the collimator lens unit 8 and the light source device 100 is prevented, and the loss of light is reduced.

As illustrated in FIG. 3, in the present exemplary embodiment, the phosphor layer 9B is disposed at the inner side with respect to the diffuser layer 90C. The reason for this is described. As illustrated in FIGS. 5A, 5B, 6A, and 6B, the divergence angle $\theta_{9B}$ of light emitted from the phosphor layer 9B is likely to be greater than the divergence angle $\theta_{90C}$ of light emitted from the diffuser layer 90C. That is, the diameter of the condenser lens unit 6 is likely to be larger than the diameter of the collimator lens unit 8. Therefore, in the present exemplary embodiment, the phosphor layer 9B is disposed at the inner side with respect to the diffuser layer 90C, and the condenser lens unit 6 is disposed near the rotation shaft of the rotating wheel 9. As a result, the light source device 100 can be downsized.

As illustrated in FIG. 2, the condenser lens 81 is disposed on the motor M side of the rotating wheel 9. In a case where the diffuser layer 90C is disposed at inner side with respect to the phosphor layer 9B contrary to the present exemplary embodiment, the condenser lens 81 may be disposed at a position closer to the motor M than the position in the present exemplary embodiment, and the condenser lens 81 and the motor M may interfere with each other. In the present exemplary embodiment, to avoid interference between the condenser lens 81 and the motor M, the diffuser layer 90C is disposed outside the phosphor layer 9B. In the present exemplary embodiment, the phosphor layer 9B is disposed at the inner side with respect to the diffuser layer 90C to also reduce the cost of the phosphor layer 9B.

(Variations)

As illustrated in FIG. 2, the number of blue LD banks included in the second light source unit 2 is greater than the number of blue LD banks included in the first light source unit 1. That is, the amount of light incident on the phosphor layer 9B is greater than the amount of light incident on the diffuser layer 90C. Thus, the phosphor layer 9B that tends to become hot in comparison with the diffuser layer 90C may be disposed outside the diffuser layer 90C, contrary to the present exemplary embodiment, so that the phosphor layer 9B is easily cooled.

Figure 7:
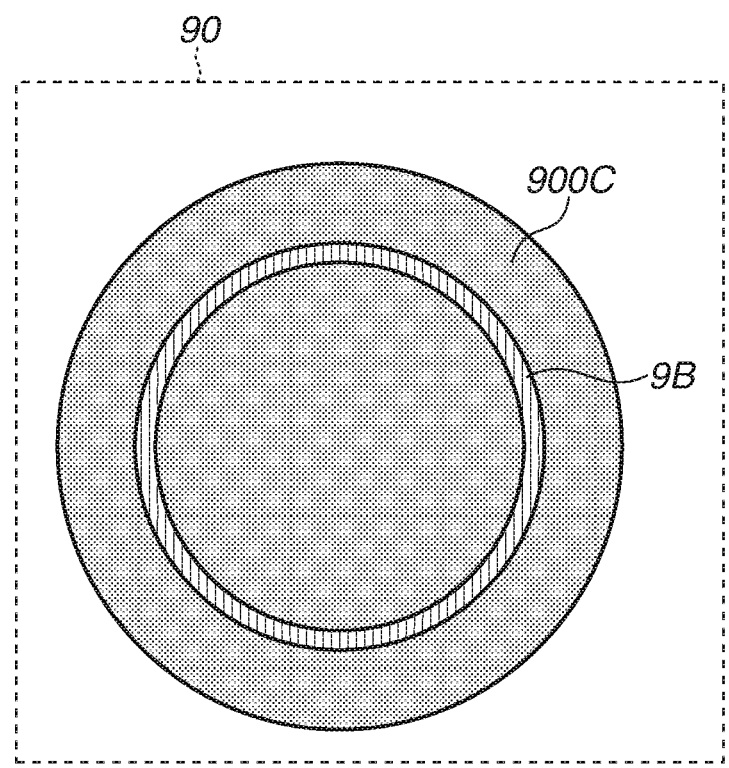
FIG. 7 is a diagram illustrating a variation of the rotating wheel.

Instead of the rotating wheel 9, a rotating wheel 90 illustrated in FIG. 7 may be used. The rotating wheel 90 includes circular plate-like diffusion glass 900C and the phosphor layer 9B applied on metal coating on the diffusion glass 900C. The rotating wheel 90 having such a configuration can also exert a function similar to that of the rotating wheel 9.

Figure 8:
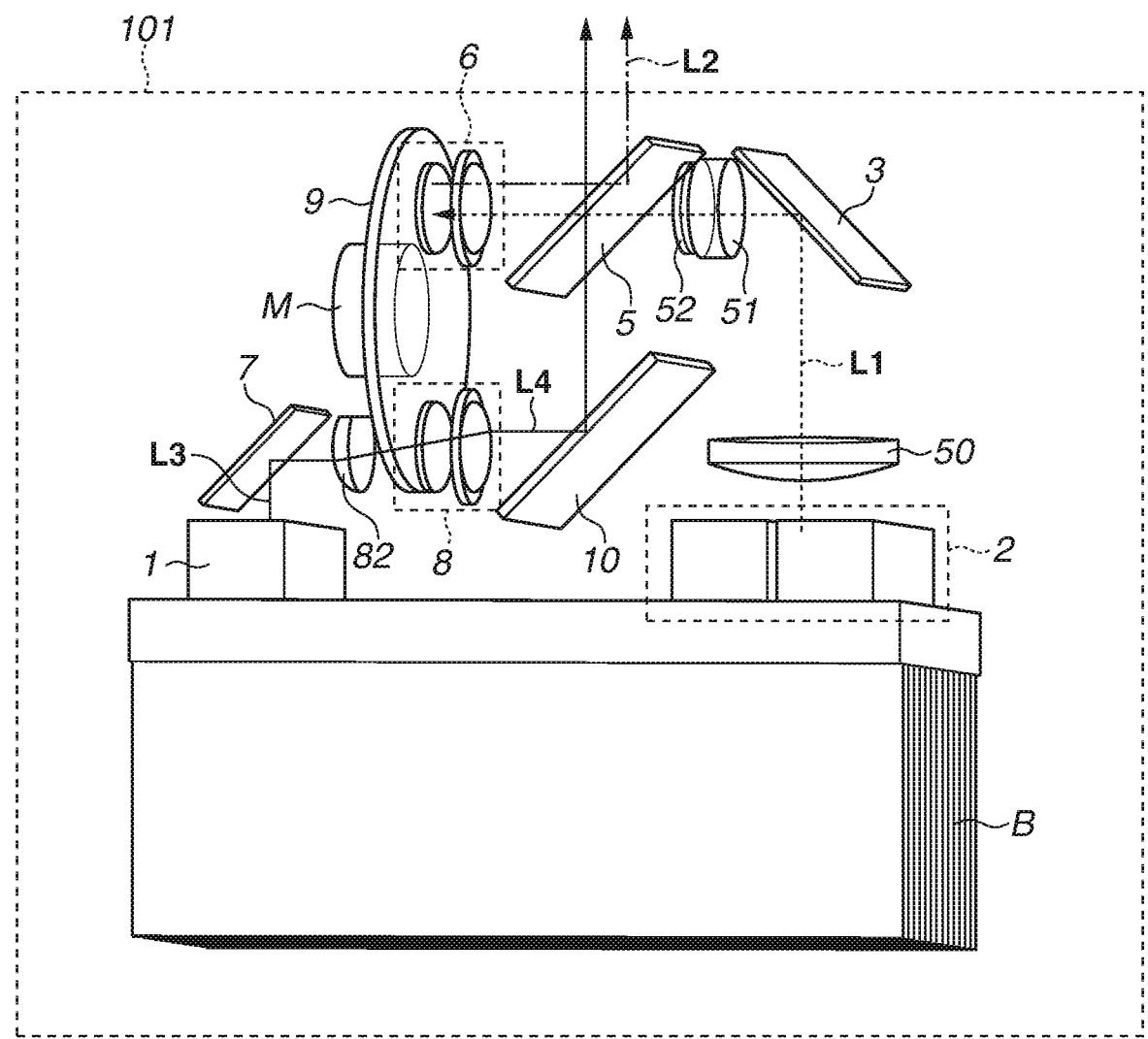
FIG. 8 is a diagram illustrating a configuration of a variation of the light source device according to the first exemplary embodiment.

Instead of the condenser lens 81, a condenser lens 82 illustrated in FIG. 8 may be used. The condenser lens 82 has a so-called D-cut shape and is flat on the motor M side. Thus, the condenser lens 82 can be disposed at a position closer to the motor M than the position of the condenser lens 81. In a light source device 101 illustrated in FIG. 8, light passed through the condenser lens 82 is incident on the diffuser layer 90C at such an angle as to be close to the rotation shaft of the rotating wheel 9.

Figure 9:
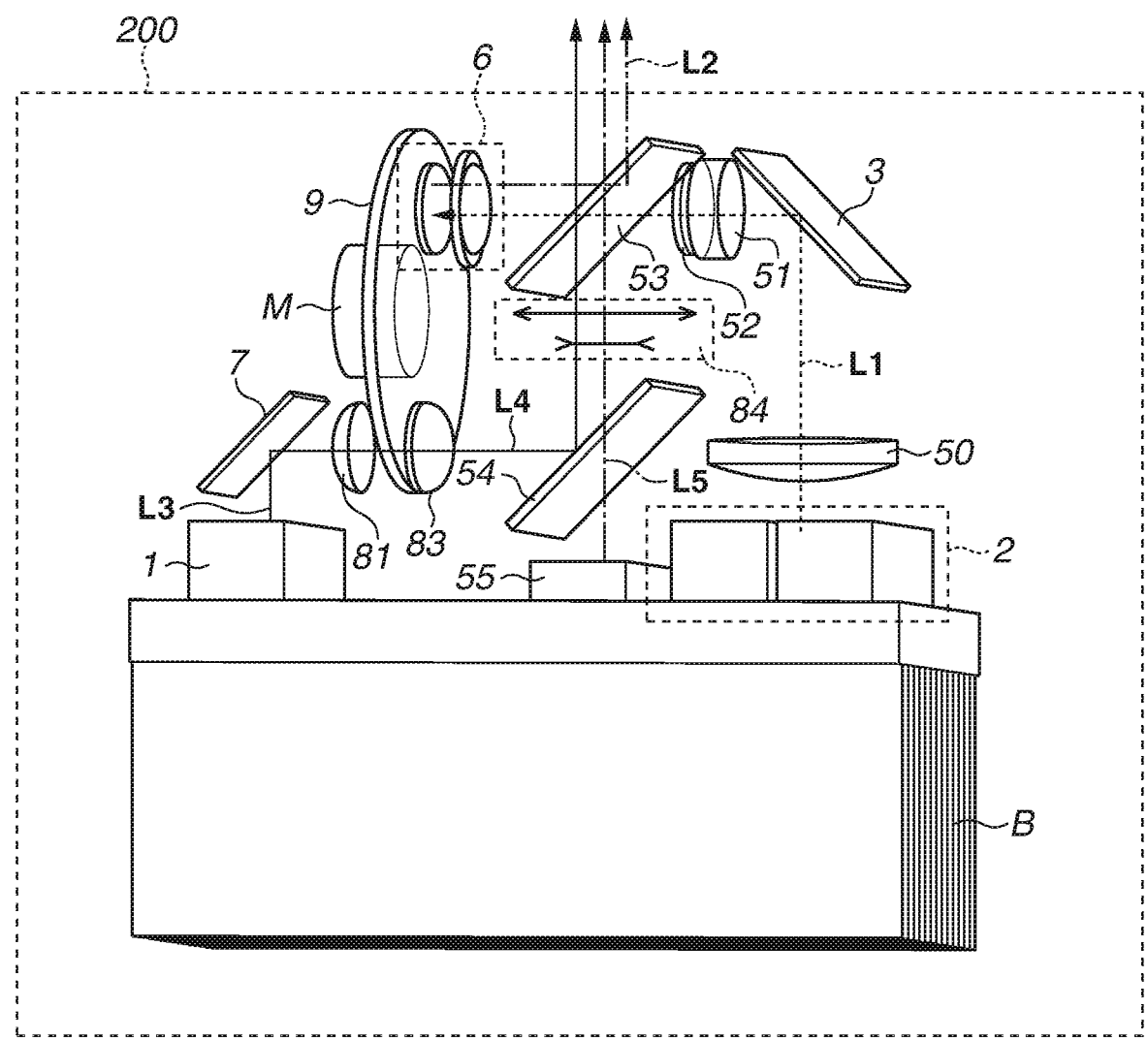
FIG. 9 is a diagram illustrating a configuration of a light source device according to a second exemplary embodiment.

With reference to FIG. 9, the light source device 200 according to the second exemplary embodiment is described. The light source device 200 is mainly different from the light source device 100 in that a third light source unit 55 is additionally disposed.

(Optical Path of Blue Light Emitted from First Light Source Unit 1)

The optical path of blue light emitted from the first light source unit 1 according to the present exemplary embodiment is described. Blue light (parallel light) L3 emitted from the first light source unit 1 is incident on the diffuser layer 90C after passing through the condenser lens 81. Diffused light L4 from the diffuser layer 90C is converted into parallel light by a collimator lens 83 and incident on a dichroic mirror (second dichroic mirror or second combining element) 54. The dichroic mirror 54 has the property of reflecting blue light and transmitting infrared (IR) light. Thus, the blue light L4 from the collimator lens 83 is reflected by the dichroic mirror 54 and incident on an afocal optical system (second afocal lens unit) 84. The afocal optical system 84 is configured to enlarge the diameter of parallel light incident on the afocal optical system 84 and includes at least one negative lens and at least one positive lens. Thus, the blue light L4 from the dichroic mirror 54 is enlarged by the afocal optical system 84 and incident on a dichroic mirror (first dichroic mirror or first combining element) 53.

Figure 10:
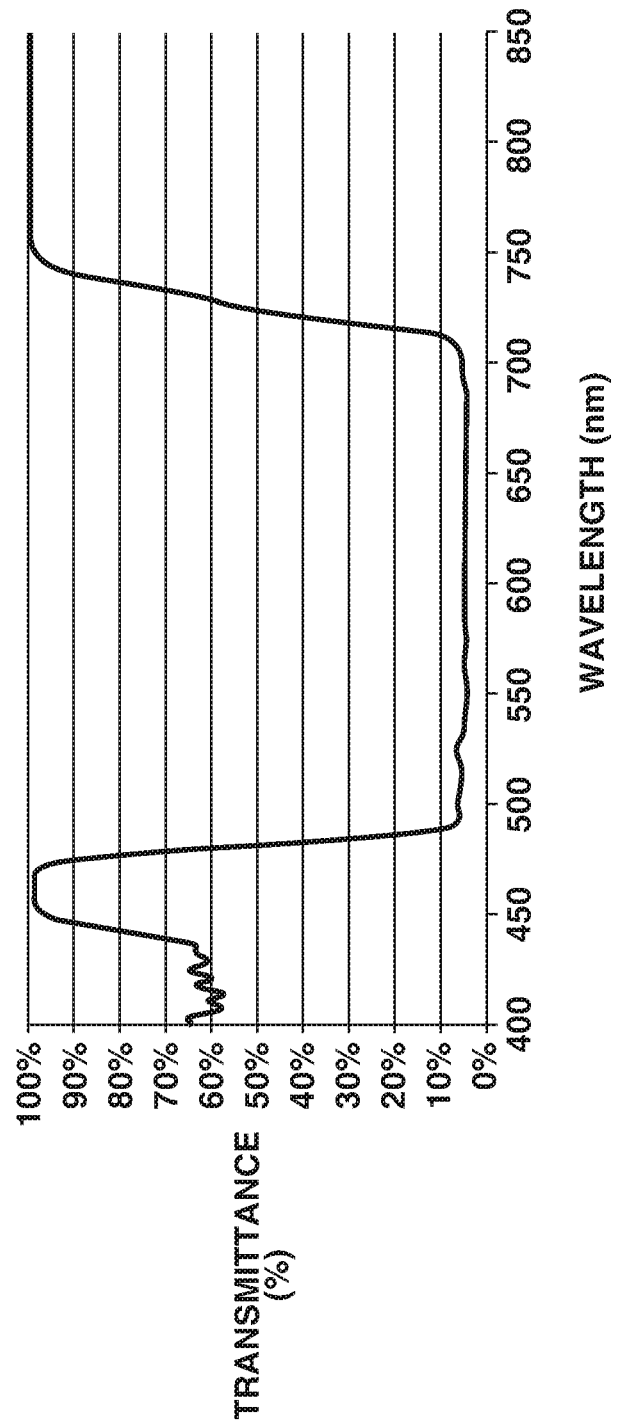
FIG. 10 is a diagram illustrating properties of a dichroic mirror according to the second exemplary embodiment.

FIG. 10 illustrates the properties of the dichroic mirror 53. As illustrated in FIG. 10, the dichroic mirror 53 has high transmittance near 465 nm, which is the wavelength of blue light emitted from the first light source unit 1 and the second light source unit 2. Then, the dichroic mirror 53 has high reflectance for a band greater than or equal to 500 nm and less than or equal to 700 nm, i.e., green light and red light, and has high transmittance for a band greater than or equal to 750 nm. Thus, the blue light L4 from the afocal optical system 84 passes through the dichroic mirror 53 and is guided to the illumination optical system 110.

(Optical Path of Blue Light Emitted from Second Light Source Unit 2)

The optical path of blue light emitted from the second light source unit 2 is similar to that in the first exemplary embodiment except that the blue light passes through the dichroic mirror 53 instead of the dichroic mirror 5, and therefore the redundant description is omitted here.

(Optical Path of IR Light Emitted from Third Light Source Unit 55)

The third light source unit 55 includes a light-emitting device, such as an LD, that emits IR light (near-infrared light) having a wavelength of 750 nm or more, and a collimator lens that converts light diverging from the light-emitting device into parallel light. IR light L5 from the third light source unit 55 passes through the dichroic mirror 54 and is enlarged by the afocal optical system 84. Then, the IR light L5 from the afocal optical system 84 passes through the dichroic mirror 53 and is guided to the illumination optical system 110.

As described above, the light source device 200 can also emit IR light in addition to white light.

In a case where the light source device 101 is mounted on the projector illustrated in FIG. 1, a color wheel is disposed between the illumination optical system 110 and the color separating/combining unit 120. Alternatively, the third light source unit 55 is configured to be turned on while the first light source unit 1 and the second light source unit 2 are turned off. Then, IR light is modulated by any of the light modulation elements 40R, 40G, and 40B and projected onto the screen S after passing through the projection lens 42. Accordingly, not only a color image but also an IR image can be projected onto the screen S.

Figure 11:
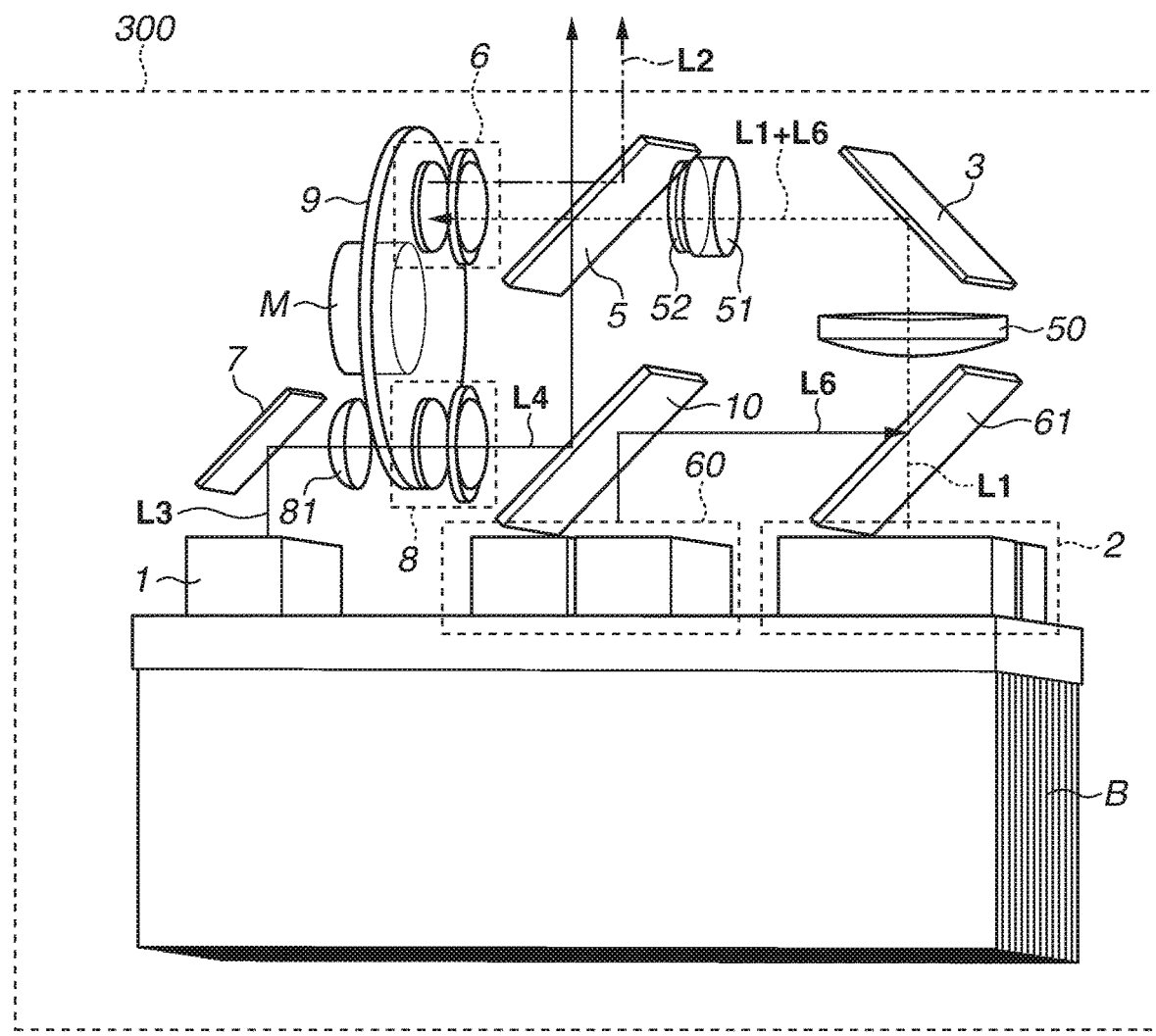
FIG. 11 is a diagram illustrating a configuration of alight source device according to a third exemplary embodiment.

With reference to FIG. 11, the light source device 300 according to the third exemplary embodiment is described. The light source device 300 is mainly different from the light source device 100 in that a fourth light source unit 60 is additionally disposed.

(Optical Path of Blue Light Emitted from First Light Source Unit 1)

The optical path of blue light emitted from the first light source unit 1 is similar to that in the first exemplary embodiment, and therefore the redundant description is omitted here.

(Optical Paths of Blue Light Emitted from Second Light Source Unit 2 and Fourth Light Source Unit 60)

Figure 12:
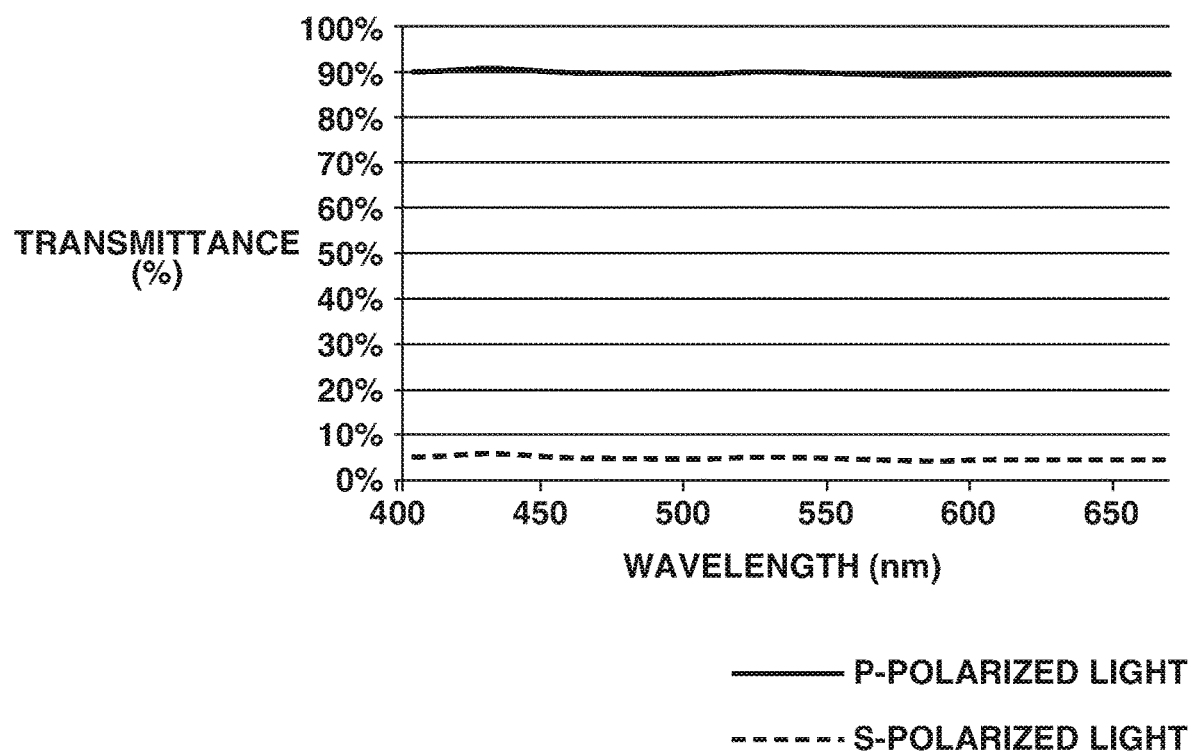
FIG. 12 is a diagram illustrating properties of a polarized light separating element according to the third exemplary embodiment.

In the first and second exemplary embodiments, the blue light L1 from the second light source unit 2 is s-polarized light. In the present exemplary embodiment, the blue light L1 is p-polarized light. Thus, the blue light L1 from the second light source unit 2 passes through a polarization beam splitter (PBS) (polarized light separating element or third combining element) 61. As illustrated in FIG. 12, in the properties of the PBS 61, the PBS 61 has high transmittance for p-polarized light and has high reflectance for s-polarized light.

Similarly to the second light source unit 2, the fourth light source unit 60 includes a plurality of blue LD banks, but blue light (third blue light) L6 from the fourth light source unit 60 is s-polarized light. Thus, the blue light L6 reflected on the mirror 10 is reflected by the PBS 61 and meets the blue light L1, and the resulting light proceeds along an optical path similar to that of the blue light L1 in the first exemplary embodiment.

As described above, in the present exemplary embodiment, blue light more than in the first exemplary embodiment can be incident on the phosphor layer 9B. Consequently, a brighter image can be projected.

Alternatively, the polarization direction of the blue light emitted from the fourth light source unit 60 may be made the same as the polarization direction of the blue light emitted from the second light source unit 2, and a half-wave plate may be disposed on the optical path from the fourth light source unit 60 to the PBS 61.

(Variations)

The first light source unit 1 and the second light source unit 2 according to each of the above exemplary embodiments may be integrally configured. For example, blue light emitted from a single light source unit may be separated into blue light (first blue light) L3 and blue light (second blue light) L1 by a half mirror (a separating element).

Figure 13:
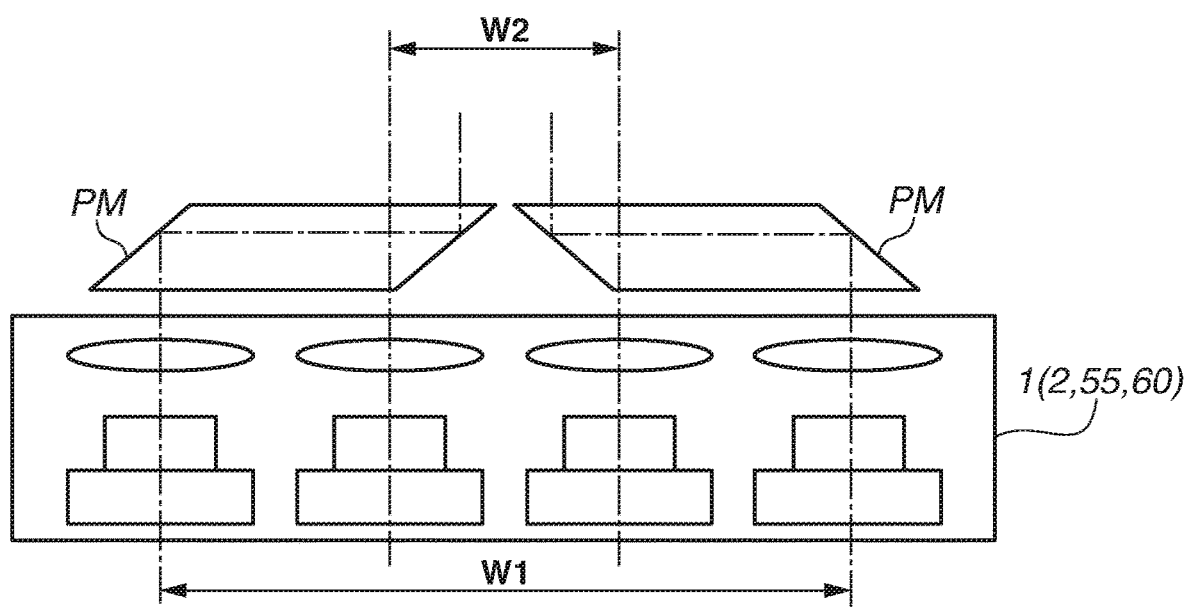
FIG. 13 is a diagram illustrating a configuration of prism mirrors applicable to each of the exemplary embodiments.

On the optical path from each of the above light source units to the rotating wheel 9, an optical element different from the optical elements illustrated in the figures may be disposed. For example, prism mirrors PM illustrated in FIG. 13 may be disposed immediately after light source units, to reduce a width W1 of light emitted from the light source units to a width W2. Instead of the prism mirrors PM, a lens of a size capable of letting in light emitted from blue LDs of the light source units may be used.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-131061, filed Jul. 16, 2019, which is hereby incorporated by reference herein in its entirety.

What is claimed is:

1. A light source device comprising:
   a light source unit configured to emit first blue light and second blue light; and
   a rotating wheel including a diffusion element provided in an annular shape and configured to diffuse and transmit the first blue light, and a wavelength conversion element provided in an annular shape and configured to convert at least a part of the second blue light into yellow light.

2. The light source device according to claim 1,
   wherein the light source unit is disposed on a base member, and
   wherein the light source unit include a first light source unit configured to emit the first blue light, and
   a second light source unit configured to emit the second blue light and different from the first light source unit in position where the second light source unit is disposed on the base member.

3. The light source device according to claim 1, further comprising a separating element configured to separate blue light emitted from the light source unit into the first blue light and the second blue light.

4. The light source device according to claim 1, further comprising a first combining element configured to combine the light from the diffusion element and the light from the wavelength conversion element,
   wherein the first combining element has a property of transmitting the light emitted from the diffusion element and reflecting the light from the wavelength conversion element.

5. The light source device according to claim 1, further comprising:
   a first combining element configured to combine the light from the diffusion element and the light from the wavelength conversion element;

a third light source unit configured to emit near-infrared light; and a second combining element configured to combine the light from the diffusion element and the light emitted from the third light source unit, wherein the first combining element has a property of transmitting the light emitted from the diffusion element and the light emitted from the third light source unit and reflecting the light from the wavelength conversion element.

6. The light source device according to claim 2, further comprising:

a fourth light source unit configured to emit third blue light; and a third combining element configured to combine the light emitted from the second light source unit and the light emitted from the fourth light source unit.

7. The light source device according to claim 6, wherein the third combining element is a polarized light separating element, and wherein a polarization direction of the third blue light is different from a polarization direction of the second blue light.

8. The light source device according to claim 6, wherein the third combining element is a polarized light separating element, wherein a polarization direction of the third blue light is the same as a polarization direction of the second blue light, and wherein a half-wave plate is disposed on an optical path from the fourth light source unit to the polarized light separating element.

9. The light source device according to claim 1, wherein the rotating wheel includes a circular plate-like rotating plate, and wherein the diffusion element and the wavelength conversion element are disposed on the rotating plate.

10. The light source device according to claim 1, wherein the wavelength conversion element is disposed at an inner side with respect to the diffusion element.

11. The light source device according to claim 1, wherein the diffusion element has a circular plate shape, wherein the wavelength conversion element has an annular shape, and wherein the wavelength conversion element is disposed in the diffusion element.

12. The light source device according to claim 2, further comprising a first afocal lens unit configured to compress the second blue light.

13. The light source device according to claim 2, further comprising a second afocal lens unit configured to enlarge the first blue light.

14. The light source device according to claim 1, further comprising:

a first condenser lens unit configured to guide the first blue light to the diffusion element;

a collimator lens unit configured to convert the light from the diffusion element into parallel light; and a second condenser lens unit configured to guide the second blue light to the wavelength conversion element.

15. The light source device according to claim 14, wherein $$1.2 \leq f1/f2 \leq 10$$

is satisfied, where a focal length of the collimator lens unit is f1, and a focal length of the second condenser lens unit is f2.

16. The light source device according to claim 15, wherein $$2.0 \leq f1/f2 \leq 6.0$$

is further satisfied.

17. The light source device according to claim 1, wherein $$1° \leq \Phi \leq 30°$$

is satisfied, where a diffusion angle of the diffusion element is $\Phi$.

18. The light source device according to claim 17, wherein $$1° \leq \Phi \leq 15°$$

is further satisfied.

19. An image projection apparatus comprising:

a light source device;

a light modulation element; and a lens holding unit configured to hold a projection lens configured to guide light from the light modulation element to a projection target surface, wherein the light source device comprising:

a light source unit configured to emit first blue light and second blue light; and a rotating wheel including a diffusion element provided in an annular shape and configured to diffuse and transmit the first blue light, and a wavelength conversion element provided in an annular shape and configured to convert at least a part of the second blue light into yellow light.

* * * * *